(12) United States Patent
Fraas et al.

(10) Patent No.: US 7,388,146 B2
(45) Date of Patent: Jun. 17, 2008

(54) PLANAR SOLAR CONCENTRATOR POWER MODULE

(75) Inventors: Lewis M. Fraas, Issaquah, WA (US);
Jany X. Fraas, Issaquah, WA (US);
Han Xiang Huang, Issaquah, WA (US);
James E. Avery, Issaquah, WA (US)

(73) Assignee: JX Crystals Inc., Issaquah, WA (US)

( * ) Notice: Subject to any disclaimer, the term of this patent is extended or adjusted under 35 U.S.C. 154(b) by 520 days.

(21) Appl. No.: 10/209,900

(22) Filed: Aug. 2, 2002

(65) Prior Publication Data

US 2003/0201007 A1    Oct. 30, 2003

Related U.S. Application Data

(60) Provisional application No. 60/374,808, filed on Apr. 24, 2002, provisional application No. 60/391,122, filed on Jun. 24, 2002.

(51) Int. Cl.
*H01L 31/0232* (2006.01)

(52) U.S. Cl. ....................... 136/246; 136/251

(58) Field of Classification Search ................. 136/246
See application file for complete search history.

(56) References Cited

U.S. PATENT DOCUMENTS

| | | | |
|---|---|---|---|
| 3,229,682 A * | 1/1966 | Perlmutter et al. | 126/698 |
| 3,232,795 A * | 2/1966 | Gillette et al. | 136/246 |
| 3,433,676 A | 3/1969 | Stein | |
| 3,751,303 A | 8/1973 | Kittl | |
| 3,769,091 A * | 10/1973 | Leinkram et al. | 136/246 |
| 3,912,540 A * | 10/1975 | Broder | 136/256 |
| 3,923,381 A * | 12/1975 | Winston | 359/852 |
| 3,929,510 A | 12/1975 | Kittl | |
| 4,003,756 A * | 1/1977 | Abrams | 136/246 |
| 4,017,758 A | 4/1977 | Almer et al. | |

(Continued)

FOREIGN PATENT DOCUMENTS

JP    63-316486    12/1988

OTHER PUBLICATIONS

"Thermal Properties of Materials" Table 116, Materials Science and Engineering Handbook, Ed. James F. Shackelford and W. Alexander. Boca Raton: CRC Press LLC, 2001. (34 Pages).*

(Continued)

*Primary Examiner*—Nam Nguyen
*Assistant Examiner*—Jeffrey T. Barton
(74) *Attorney, Agent, or Firm*—James Creighton Wray; Clifford D. Hyra

(57) ABSTRACT

A planar concentrator solar power module has a planar base, an aligned array of linear photovoltaic cell circuits on the base and an array of linear Fresnel lenses or linear mirrors for directing focused solar radiation on the aligned array of linear photovoltaic cell circuits. The cell circuits are mounted on a back panel which may be a metal back plate. The cell circuit area is less than a total area of the module. Each linear lens or linear mirror has a length greater than a length of the adjacent cell circuit. The cell circuit may have cells mounted in shingle fashion to form a shingled-cell circuit. In an alternative module, linear extrusions on the circuit element have faces for mounting the linear mirrors for deflecting sun rays impinging on each mirror onto the shingled-cells. The linear extrusions are side-wall and inner extrusions with triangular cross-sections. The circuit backplate is encapsulated by lamination for weather protection. The planar module is generally rectangular with alternating rows of linear cell circuits and linear lenses or linear mirrors.

9 Claims, 5 Drawing Sheets

U.S. PATENT DOCUMENTS

| | | | |
|---|---|---|---|
| 4,045,246 A * | 8/1977 | Mlavsky et al. | 136/246 |
| 4,069,812 A | 1/1978 | O'Neill | |
| 4,131,485 A | 12/1978 | Meinel et al. | |
| 4,180,414 A | 12/1979 | Diamond et al. | |
| 4,234,352 A | 11/1980 | Swanson | |
| 4,239,555 A * | 12/1980 | Scharlack et al. | 136/251 |
| 4,331,829 A | 5/1982 | Palazzetti et al. | |
| 4,388,481 A * | 6/1983 | Uroshevich | 136/246 |
| 4,707,560 A | 11/1987 | Hottel et al. | |
| 4,746,370 A | 5/1988 | Woolf | |
| 4,776,895 A | 10/1988 | Goldstein | |
| 4,789,641 A * | 12/1988 | Inuzuka | 438/62 |
| 4,906,178 A | 3/1990 | Goldstein et al. | |
| 4,976,606 A | 12/1990 | Nelson | |
| 5,044,939 A | 9/1991 | Dehlsen | |
| 5,080,724 A | 1/1992 | Chubb | |
| 5,091,018 A | 2/1992 | Fraas et al. | |
| 5,096,505 A | 3/1992 | Fraas et al. | |
| 5,118,361 A | 6/1992 | Fraas et al. | |
| 5,123,968 A | 6/1992 | Fraas et al. | |
| 5,217,539 A | 6/1993 | Fraas et al. | |
| 5,248,346 A | 9/1993 | Fraas et al. | |
| 5,255,666 A | 10/1993 | Curchod | |
| 5,312,521 A | 5/1994 | Fraas et al. | |
| 5,344,497 A | 9/1994 | Fraas et al. | |
| 5,356,487 A | 10/1994 | Goldstein et al. | |
| 5,383,976 A | 1/1995 | Fraas et al. | |
| 5,389,158 A | 2/1995 | Fraas et al. | |
| 5,401,329 A * | 3/1995 | Fraas et al. | 136/253 |
| 5,403,405 A | 4/1995 | Fraas et al. | |
| 5,439,532 A | 8/1995 | Fraas | |
| 5,505,789 A | 4/1996 | Fraas et al. | |
| 5,512,109 A | 4/1996 | Fraas et al. | |
| 5,551,992 A | 9/1996 | Fraas | |
| 5,560,783 A | 10/1996 | Hamlen | |
| 5,601,661 A | 2/1997 | Milstein et al. | |
| 5,616,186 A | 4/1997 | Fraas et al. | |
| 5,651,838 A | 7/1997 | Fraas et al. | |
| 5,865,906 A | 2/1999 | Ferguson et al. | |
| 5,942,047 A | 8/1999 | Fraas et al. | |
| 6,037,536 A | 3/2000 | Fraas | |
| 6,091,017 A * | 7/2000 | Stern | 136/246 |
| 6,091,018 A | 7/2000 | Fraas et al. | |
| 6,177,628 B1 | 1/2001 | Fraas et al. | |
| 6,198,038 B1 | 3/2001 | Shukla et al. | |
| 6,218,607 B1 | 4/2001 | Mulligan et al. | |
| 6,232,545 B1 | 5/2001 | Samaras et al. | |
| 6,235,983 B1 | 5/2001 | Becker et al. | |
| 6,271,461 B1 | 8/2001 | Fraas et al. | |
| 6,291,761 B1 * | 9/2001 | Takada et al. | 136/244 |
| 6,528,716 B2 * | 3/2003 | Collette et al. | 136/246 |

OTHER PUBLICATIONS

Howe et al; *The characteristics of atmospheric-type burners when used with natural gas*; Proc. of Semi-annual Meeting of ASME; Jul. 10, 1939; pp. 673-677.

Kittl et al.; *Design analysis of TPV-generator system*; Proceedings of 25th Annual Meeting of Power Sources Conference; May 1972; pp. 106-110.

Tester et al.; *Comparative performance characteristics of cylindrical, parabolic, and flat plate solar energy colectors*; Presentation at annual winter meeting of ASME, Nov. 17-22, 1974; 12 pages.

Fraas et al.; *Concentrated and piped sunlight for indoor illumination*; Applied Optics, vol. 2, No. 4; Feb. 15, 1983; pp. 578-582.

Höffler et al.; *Selective emitters for thermophotovoltaic solar energy conversion*; Solar Cells, vol. 10; 1983; pp. 257-271.

Lampert, Carl M.; *Heat mirror coatings for energy conserving windows*; Solar Energy Materials; vol. 6; 1981; pp. 1-41.

Höfler et al.; *Interference filters for thermophotovoltaic solar energy conversion*; Solar Cells, vol. 10; 1983; pp. 273-286.

Höfler et al.; *Selective absorbers and interference filters for thermophotovoltaic energy conversion*; Proceedings of 5th Photovoltaic Energy Conference, Athens, Greece; Oct. 1983; pp. 225-229.

O'Neill, Mark J.; *Development of a Fresnel lens gallium arsenide photovoltaic concentrator for space applications*; Final Technical Report NASA Contract NAS3-24871; Sep. 1986.

Pelka et al.; *Natural gas fired thermophotovoltaic system*; Proceedings of the 32nd International Power Sources Conference, Cherry Hill, NJ; Jun. 1986; pp. 110-123.

Woolf, L. D.; *Optimum efficiency of single and multiple bandgap cells in thermophotovoltaic energy conversion*; Solar Cells, vol. 19; 1986-1987; pp. 19-31.

Todorof, Bill; *A 450 suns concentrator module design*; Conference Record, 20th IEEE Photovoltaic Specialists conference, Las Vegas, NV; Sep. 1988; pp. 1347-1352.

Morgan et al.; *Radioisotope thermalphotovoltaic application of the GaSb solar cell*; Proceedings of NASA Sprat Conference, Cleveland, OH; Nov. 7-9, 1989; pp. 349-358.

Chubb, Donald L.; *Reappraisal of solid selective emitters*; Proceedings of 21st IEEE Photovoltaic Specialists Conference, Kissimmee, FL; May 1990; pp. 1326-1333.

Day et al.; *Application of the GaSb solar cell in isotope-heated power systems*; Proceedings of 21st IEEE Photovoltaic Specialists Conference, Kissimmee, FL; May 1990; pp. 1320-1325.

Piszczor et al.; *The mini-dome fresnel lens photovoltaic concentrator array: current status of component & prototype panel testing*; Proceedings of 21st IEEE Photovoltaic Specialists Conference, Kissimmee, FL; May 1990; pp. 1271-1276.

Kuryla et al.; *22.7% efficient 1000X GaAs concentrator module*; Proceedings of 21st IEEE Photovoltaic Specialists Conference, Kissimmee, FL; May 1990; pp. 1142-1146.

Fraas et al.; *Over 30% efficient tandem Gallium solar cells for use with concentrated sunlight*; Optoelectronics, vol. 5, No. 2; Dec. 1990; pp. 297-310.

Doellner, Oscar L.; *Aircraft photovoltaic power-generating system*; Appendix A of Doctoral dissertation, Univ. of Arizona; 1991; p. 154.

Fraas et al.; *Advanced photovoltaic power systems using tandem GaAs/GaSb concentrator modules*; Proceedings of 3rd Annual Symp. of univ. Ariz/NASA Space Eng. Res. Center for Utilization of Local Planetary Resources; F1b. 20-22, 1992; pp. II-9-II-21.

Fraas, Lewis M.; *JX Crystals Inc.Presentation to NREL Enterprise Growth Forum*; Oct. 25, 1995; pp. 1-18.

Whitaker, Tim; *GaSb shines brighter than midnight sun*; Tech. Update: Fall 1998.

* cited by examiner

FIG. 6
FIG. 7A
FIG. 7B
FIG. 8
FIG. 9
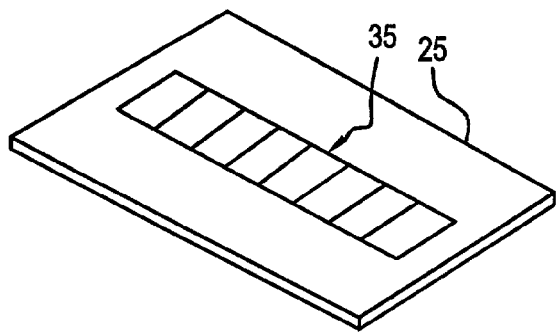
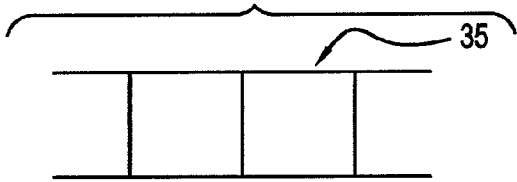
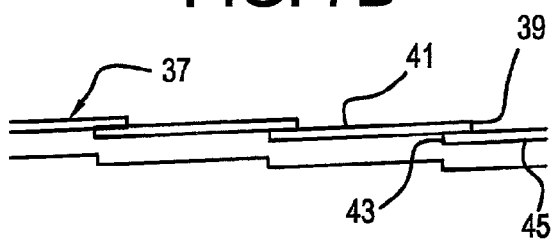
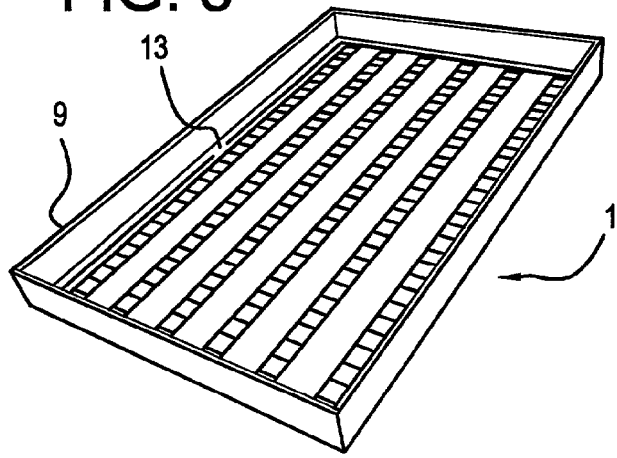
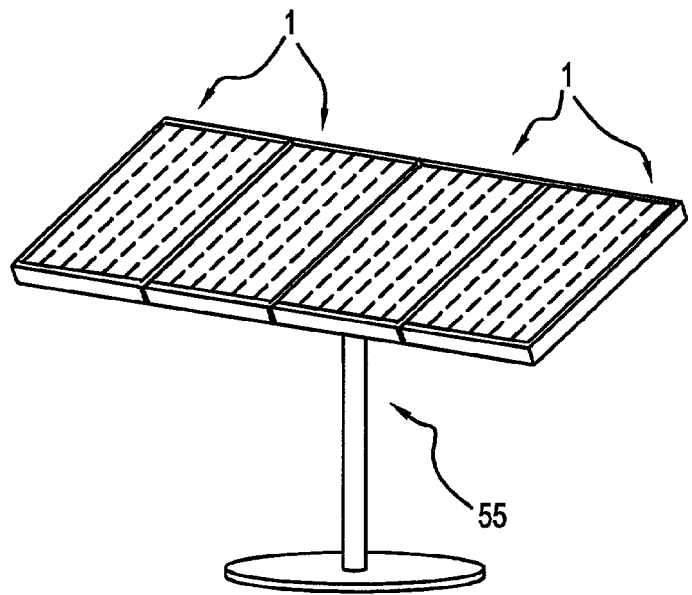

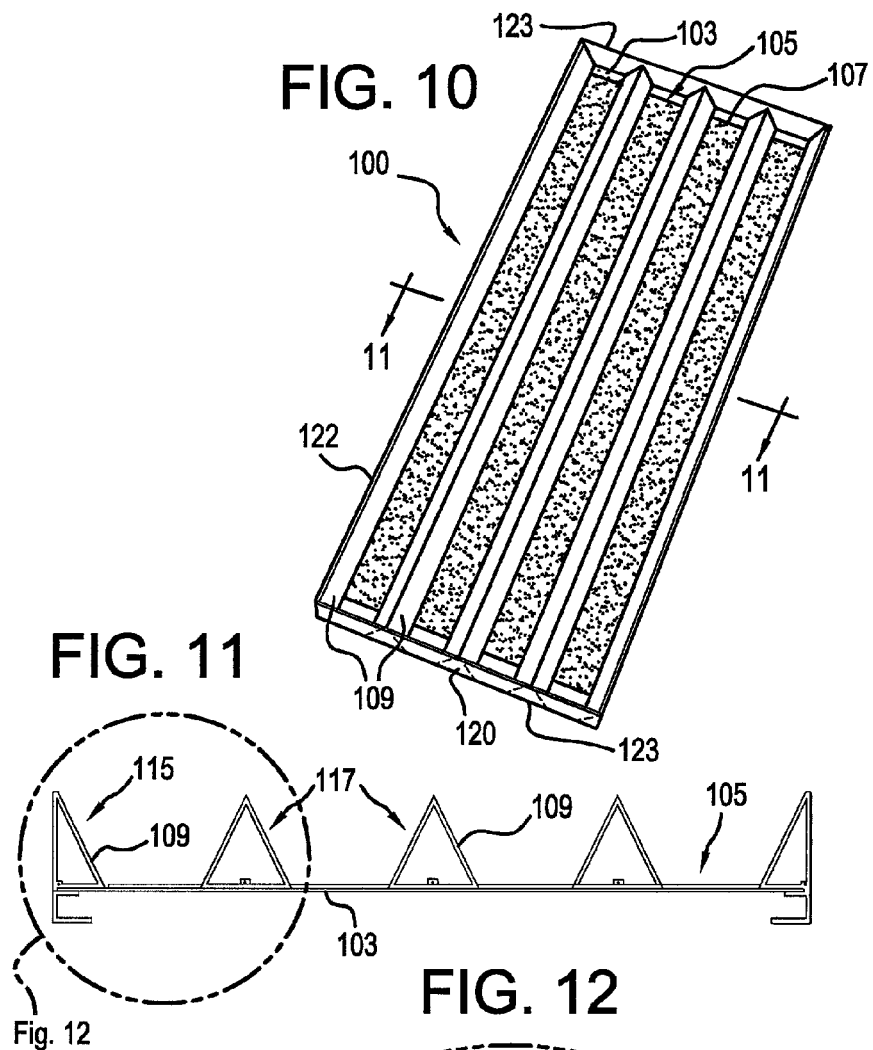
FIG. 10
FIG. 11
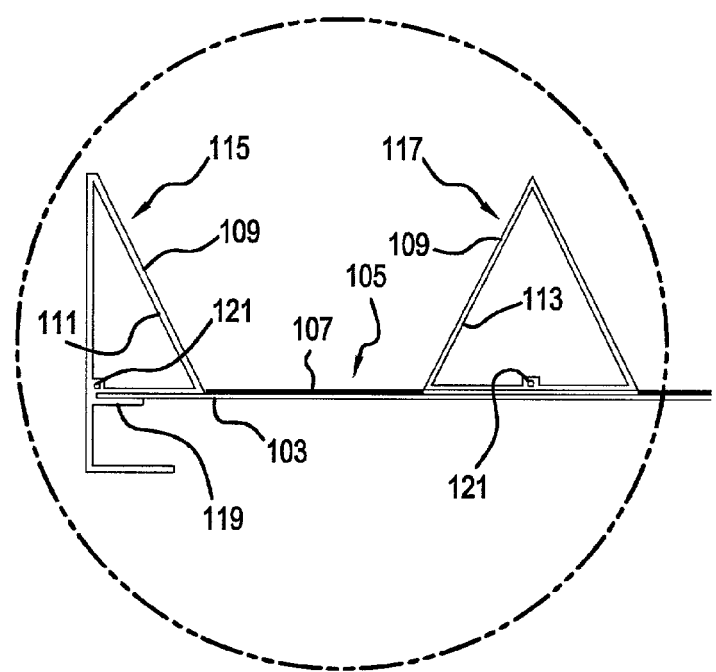
FIG. 12

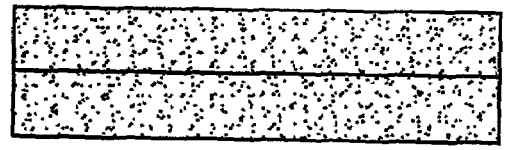
FIG. 13A
FIG. 13B
FIG. 13C
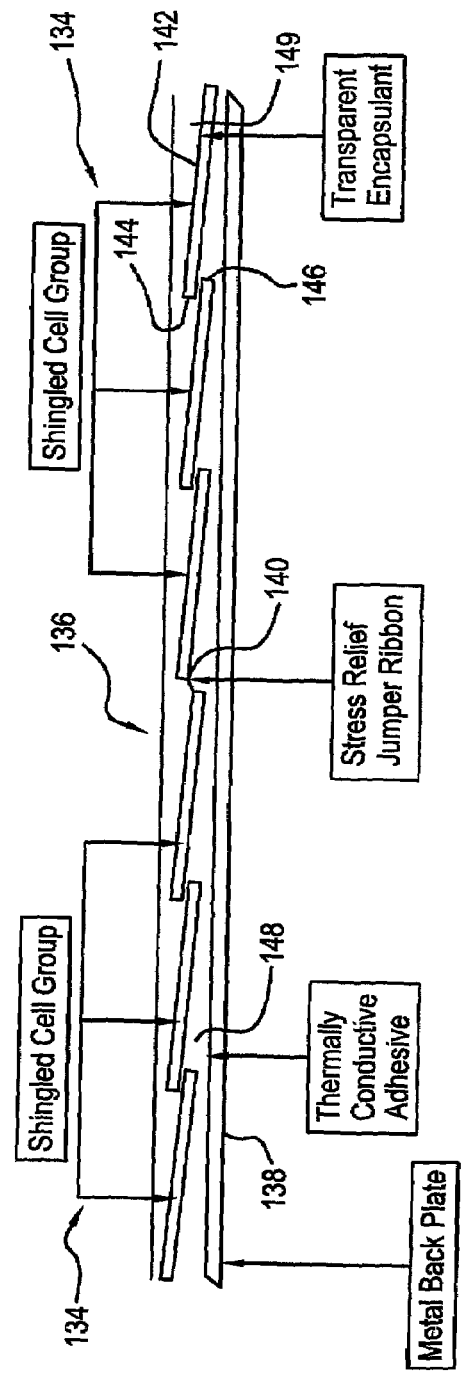
FIG. 14

PLANAR SOLAR CONCENTRATOR POWER MODULE

This application claims the benefit of U.S. Provisional Application No. 60/374,808 filed Apr. 24, 2002 and U.S. Provisional Application No. 60/391,122 filed Jun. 24, 2002.

BACKGROUND OF THE INVENTION

Solar cells generate electricity but at a cost which is too high to compete with electricity from the electric power company. It is generally acknowledged that the solar panel cost will have to drop to approximately $1 to $2 per installed Watt before solar cells can compete in this large potential market. Today's cost for solar panels is in the $6 to $7 per Watt range. Three different approaches have been pursued in attempts to resolve this cost problem.

The conventional approach is to use large silicon solar cells tiled in planar modules where the cell area represents over 80% of the total panel area. The cells in this approach can be single crystal or large grain polycrystalline cells. This approach represents over 90% of the market but the cost of this approach has bottomed out and no further cost reductions are expected.

The second approach is based on the assumption that the cost of silicon wafers is too high and one needs to make low cost thin film cells. The argument is that paint is cheap and that maybe a way can be found to make paints generate electricity. This thin film approach includes amorphous silicon and small grain-size polycrystalline materials like CuInSe2 and CdTe. The problem with this approach has been that destroying the crystal material degrades solar cell performance. To date, this approach has not yielded modules costing less than $8 per Watt.

The third approach is based on concentrating the sunlight onto small single crystal cells using larger inexpensive plastic lenses or metal mirrors. This approach allows more efficient cells to be used and makes good technical sense. However, the problems with this approach are not technical but instead relate to business and politics. Solving the business problems inherent in this approach is the focus of this invention.

Serious attempts to develop solar concentrator photovoltaic systems can again be divided into three parts. First, attempts have been made to use point focus lenses and 30% efficient cells where the systems operate at high concentration ratios, e.g. approximately 500 suns. The problem here is not with the technology. The various components work, and systems have been demonstrated. The problem here is that the investment required to create positive cash flow is too large. Large companies will not take the risk and small companies do not have the resources and the government is not helping. The 30% cells are not being manufactured and investment is required here. Furthermore, trackers with the required accuracy are not being manufactured. Again investment is required. Investment is also required for the thermal management and lens elements. Finally, these systems are not cost effective unless made in large sizes and in large volumes and there are no intermediate markets other than the utility scale market.

The second approach to solar concentrators involves the use of arched linear Fresnel lenses and linear silicon solar cell circuits. These systems are designed to operate at approximately 20 suns. This is also a technically proven approach but this approach also suffers from the investment problem. Here, investment is again required for special lenses, trackers, and thermal management systems. Here, the plan is that the cells will be available from the cell suppliers who make planar arrays. However, this presents two problems. The first problem is that the planar cells have to be significantly modified to operate at 20 suns. The second problem is that the planar cell suppliers are not motivated to cooperate. For example, suppose that the concentrator approach proves to be cheaper and the market expands by three times. The problem for the planar cell suppliers is that their part will actually shrink by 3/20 times. Again, these systems are not cost effective unless made in large sizes and in large volumes and there are no intermediate markets other than the utility scale market.

The third approach to solar concentrator systems was initiated by the planar module manufactures. Realizing that if their one sun planar module were operated at 1.5 suns, they could produce 1.5 times more power and consequently reduce the cost of solar electricity by 1.5 times, they built a system using edge mirrors to deflect sunlight from the edge areas onto their panels. Unfortunately, this approach was technically naive. The problem encountered was that the modules then absorbed 1.5 times more energy and there was no provision to remove the additional heat. This then affected the module lifetime.

Solar concentrators require very high investments to scale up production of a new concentrator cell. The investment required for manufacturing scale-up versions of a new cell is prohibitive. Another problem that needs to be solved is the cell-interconnect problem.

There is a need for a solar concentrator module that is a retrofit for a planar module and that is easier and cheaper to make. The business infrastructure for trackers and lenses should already be in-place. The heat load should be easily manageable. Investment requirements should be manageable and it should not threaten existing cell suppliers. Cells to be used should be available with very minor changes relative to planar cells. Therefore, low cost cells should be available from today's cell suppliers. Finally, it should be usable in early existing markets in order to allow early positive cash flow.

SUMMARY OF THE INVENTION

The present invention addresses and resolves the above needs. FIGS. 1, 2, and 3 show a preferred planar concentrator solar power module. The unit depicted measures, but is not limited to, 25" by 40" by 3.25" deep. The size depicted is exemplary and is similar to 75 W planar modules manufactured by Siemens, Kyocera, and Solarex. All of these modules measure approximately 25" by 40" and produce about the same power. Other sizes are also within the scope of this invention.

The conventional planar modules consist of large silicon cells sandwiched between plastic sheets with a glass front plate surrounded by a 2" thick metal frame, for example aluminum frame, for rigidity. Our preferred planar concentrator solar module consists of a back metal sheet upon which linear silicon cell circuits are mounted. In the embodiment depicted, there are plural circuits, as for example but not limited to, 6 circuits containing cells approximately 1.3" or 1.2" wide. The circuit separation is, for example, 4" or 3.6". Therefore, the cell area represents one third of the total module area resulting in a major cost reduction for cells.

In the preferred module, as an example, a 3.25" thick metal frame, for example, aluminum frame, surrounds the module with the cells mounted on the back panel. A lens array is mounted on a glass sheet forming the front side of the planar concentrator solar module. There are, for example, 6 linear Fresnel lenses on this front sheet with each lens being, for example, about 3.6" or about 4" wide and aligned such that the solar rays from each lens impinge on a linear power circuit. In the exemplary case, there are 6 lenses and 6 aligned circuits. Other configurations with more or less lenses and more or less circuits are within the scope of this invention. Alternatively, several of these goals may be accomplished using linear extruded elements with mirrored faces.

The modules are manufactured at a cost below today's module cost. A price in the $3 to $4 per Watt range, below the present $6 to $7 per Watt range, and subsequently, at the $1 to $2 per Watt range, is targeted. A successful 3-sun module results in a larger investment enabling the $1 to $2 per Watt target to be eventually achieved with 30% efficient concentrator cells operating at higher concentration ratios.

Applicants have previously described a similar linear lens and linear circuit configuration for a different set of applications. In that disclosure, we noted that the preferred pointing requirement for this design is very broad, being greater than +/−5 degrees in both directions. One preferred embodiment of that device incorporates Fresnel lenses and silicon solar cells. For example, a 6"×8" solar battery charger, about 2.5" thick may yield about 4 W. It can collapse to about ½" thickness for easy transportation. Angle tolerance along the circuit length/direction is about +/−20 degrees which corresponds to over two hours between alignments. For example, if one sets the circuits vertical in the early morning and late afternoon, and horizontal in the midday, the device will require 3 alignments in an eight-hour period. 30% efficient cells of about 8"×12" yield 16 W.

Advantages of the present planar solar concentrator power module include, but are not limited to, the following:

1. The cells are mounted in rows on a metal back plate with the rows close enough to each other that the heat can spread in the back plate so that the air cooling area is similar to that of the standard planar module.
2. The cells used may be obtained from several different planar cell suppliers requiring only a minor change in grid design, for example changes in size and front metal pattern, to operate at 2-3 suns.
3. The linear circuit assembly may be automated leading to a further cost savings relative to traditional planar module assembly, which is presently, labor intensive.
4. The thermal management is easily handled. The heat spreads in the back metal plate such that the air contact area for heat removal is the same as the lens area. This means that the heat removal is equivalent to the planar module case.
5. There are already several Fresnel lens suppliers. The concentration ratio is low and not technically challenging. The lenses should be low cost when made in high volume.
6. The modules are designed such that the elongated dimension, the cell rows, and the linear concentrator elements are oriented along the North-South direction with the linear concentrator elements being longer than the cell rows so that the modules can be mounted on single axis trackers without requiring seasonal adjustments.
7. The modules operate at low concentration on simple single-axis trackers requiring pointing tolerance of no less than +/−2 degrees.
8. This unit resembles smaller units in design and assembly and can be used in different devices such as, but not limited to, solar battery chargers for cell phones, digital cameras, PDAs such as, but not limited to, the Palm Pilot, laptop computers, etc.
9. The planar modules and the concentrator modules are similar in form and function.
10. The concentrator module unit operates at two-suns or three-suns using one-half or one-third the silicon solar cell area relative to traditional planar panels thus leading to a major cost savings.
11. The cells used can be obtained from several different planar cell suppliers requiring only a minor change to operate at two-suns or three-suns.
12. The concentration ratio is low and not technically challenging. Extruded linear elements with mirrored faces are low cost.
13. The tracking accuracy requirement is minimal. This means that commercially available liquid refrigerant trackers from Zomeworks can be used.
14. The Zomeworks trackers are presently used with planar solar modules for farm irrigation systems. This means that there is an immediate intermediate market with marketing channels already established.
15. The fact that this unit resembles a traditional planar solar module will lead to easy customer acceptance. Thereafter, it would lead to an even more lower cost, higher concentration ratio systems.

These and further and other objects and features of the invention are apparent in the disclosure, which includes the above and ongoing written specification, with the claims and the drawings.

BRIEF DESCRIPTION OF THE DRAWINGS

FIG. 6 shows a section of the back metal sheet with embossed terraces in fabricated linear circuits.

FIG. 7A and 7B shows a shingle circuit in which the cells are mounted in the terraces of FIG. 6 in a shingle fashion.

FIG. 8 shows a perspective view of a planar solar concentrator power module. Note however, as shown in FIG. 5, the lens effect is merely exemplary.

FIG. 9 shows several planar solar concentrator power-modules mounted on a solar tracker.

FIG. 10 shows a 3D view of the planar solar concentrator power module of the present invention with mirror elements.

FIG. 11 shows a cross-section through the planar solar concentrator power module of FIG. 10 at A-A.

FIG. 12 shows a blow up section from FIG. 11 showing a circuit element and two types of linear extrusions with mirrored faces.

FIG. 13A shows a commercial planar cell.

FIG. 13B shows the cell of FIG. 13A cut up into four 2× concentrator-cells.

FIG. 13C shows the cells reassembled into a shingled-cell circuit element.

FIG. 14 shows two shingled-cell circuit elements mounted on the heat spreader metal back-plate with a stress relief ribbon bond between the circuit elements.

DETAILED DESCRIPTION OF THE PREFERRED EMBODIMENTS

Figure 1:
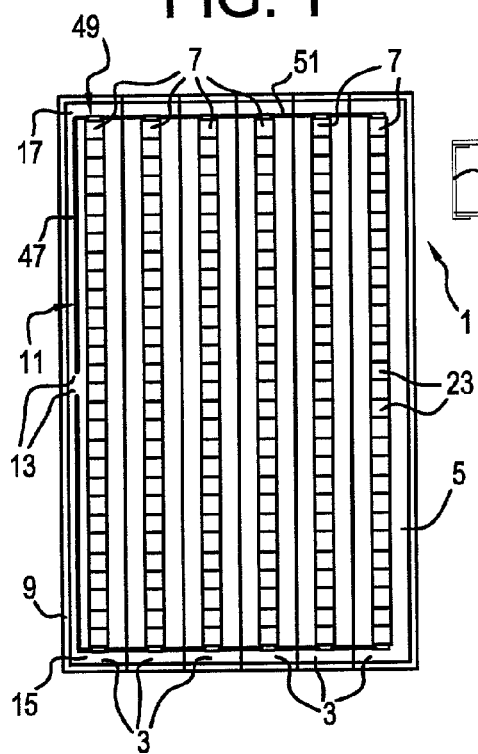
FIG. 1 shows a top view of the planar solar concentrator power module of the present invention.
Figure 2:
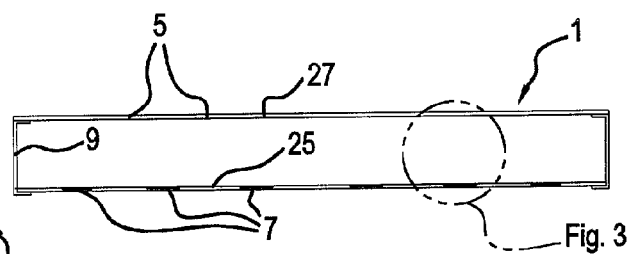
FIG. 2 shows a cross section through the planar solar concentrator power module of FIG. 1.
Figure 3:
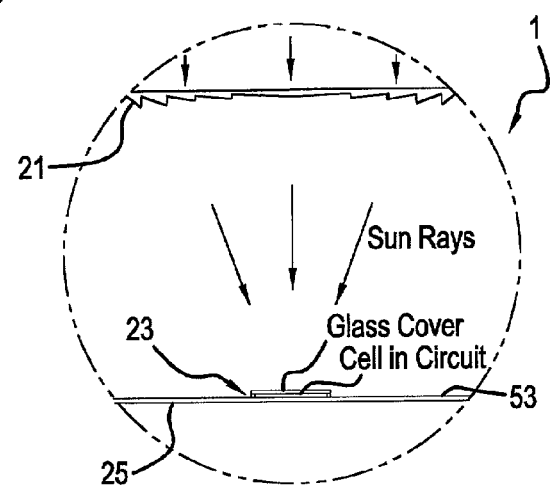
FIG. 3 shows a blow up section from FIG. 2 with a single lens and circuit element in more detail.

FIGS. 1, 2, 3, and 8 show a preferred planar concentrator solar power module 1. FIG. 1 shows a top view of the planar solar concentrator power module 1 of the present invention. An array 3 of linear Fresnel lenses 5 produces lines of focused solar radiation that fall on an aligned array of linear photovoltaic power circuits. FIG. 2 shows a cross section through the planar solar concentrator power module 1 of FIG. 1. The cross section is perpendicular to the focal lines produced by the lenses and perpendicular to the circuit length dimension. FIG. 3 shows a blow up section from FIG. 2 showing a single lens 21 and circuit element 23 in more detail.

The preferred unit depicted is exemplary with dimensions not limited to the following. For example, the preferred unit may measure 25" by 40" by 3.25" deep. The size depicted is exemplary and is similar to 75 W planar modules manufactured by Siemens, Kyocera, and Solarex. All of these modules measure approximately 25" by 40" and produce about the same power. The planar modules consist of large silicon cells sandwiched between plastic sheets with a glass front plate surrounded by a 2" thick metal frame, for example aluminum frame, for rigidity. Other dimensions are well within the scope of this invention.

The preferred planar concentrator solar module consists of a back panel of metal sheet 25 upon which linear silicon cell circuits 7 are mounted. In the exemplary embodiment depicted, there are, for example but not limited to, 6 lenses and 6 aligned circuits containing, for example, cells 23 about 1.3" or about 1.2" wide. The circuit separation is, for example, about 4" or 3.6". Therefore, the cell area represents one third of the total module area resulting in a major cost reduction for cells.

In the preferred module, for example, about a 3.25" thick metal frame 9, for example aluminum frame, surrounds the module 1 with the cells 23 of the cell circuits 7 mounted on the back panel 25. A lens array 3 is mounted on a glass front sheet 27 forming the front side of the planar concentrator solar module 1. There are, for example, 6 linear Fresnel lenses 5 on this front sheet 27 with each lens 21 being, for example, 4" wide and aligned such that the solar rays from each lens 21 impinge on a linear cell circuit 7 connected to a power circuit assembly 11 with +/−terminals 13. In the FIG. 1 example, there are 6 lenses and 6 aligned circuits. Other lens and circuit combinations are within the scope of this invention.

A preferred lens 5 has, for example, a lens width and circuit spacing of approximately 4" or 3.6". Given a lens width of 4" or 3.6", the shortest reasonably achievable focal length will be approximately 4" or 3.6" respectively. If, then, the lens is set to a cell spacing, for example, at 3.25" or 3", the focal line on the circuit will be approximately 0.75" or 0.7" wide. For a cell width of 1.3" or 1.2", there will be an illuminated region of 0.75" or 0.7" wide and dark bands on either side of (1.3−0.75)/2=0.28" or (1.2−0.7)/2=0.25" width. These dark regions will allow a tracking band of $\tan^{-1}(0.28/3.25)=+/-5$ or $\tan^{-1}(0.25/3)=+/-5$ degrees wide. We choose this tracking band tolerance precisely because this is the tracking tolerance of the commercially available Zomeworks tracker. The same applies for the 2× mirror module.

A lens width of 4" provides several advantages, Firstly, the 4" width allows for a panel thickness of 3.25", not too much thicker than a standard planar solar panel (2"). Secondly, the 4" width is advantageous for thermal management. The lenses 5 concentrate the solar energy into the circuits 7. The waste heat then is transferred to the metal back plate 25. It then spreads laterally through the metal such that the metal plate temperature is nearly uniform. If the spacing between circuits is too large, the heat will not spread uniformly and the circuits will run too hot. A 4" or 3.6" spacing does allow for a uniform plate temperature with a reasonably thin and light back metal plate. The same also applies for the 2× mirror module.

The linear Fresnel lenses 5 provide several advantages. The first relates to seasonal alignment. The sun's midday position moves north and south+/−23 degrees from summer to winter. This movement is accommodated using a linear lens 21 by making the lens length longer than the circuit 23 length and aligning the lens focal line in the north/south direction (see, for example, FIG. 1). In the present module 1, the circuits 7 are, for example but not limited to, about 1.4" or 1.3" shorter than the lens 5 at both ends 15, 17. This gives a tracking tolerance in the north/south direction of $\tan^{-1}(1.4/3.25)=+/-23$ degrees or $\tan^{-1}(1.3/3)=+/-23$ degrees, respectively.

The second reason for the having the linear Fresnel lenses 5 is that they lead to linear power circuits 7 and a linear power circuit assembly 37 (FIG. 7) can be automated.

Figure 4:
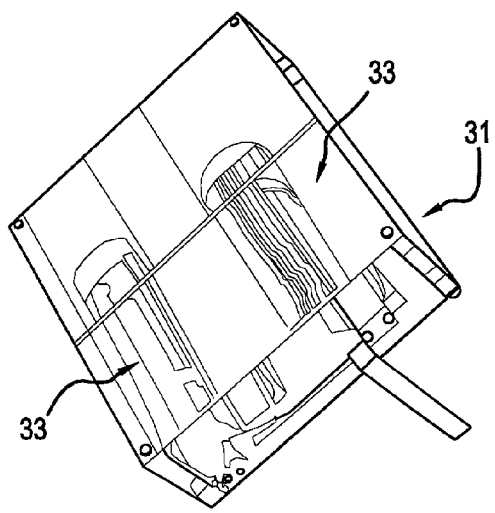
FIG. 4 is a side view of a smaller planar solar concentrator power module with two lens and circuit elements.
Figure 5:
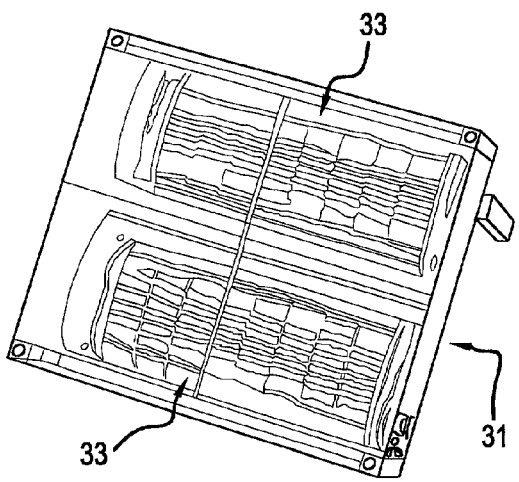
FIG. 5 shows a top view in which the lenses magnify the circuits of the power module of FIG. 4.

FIGS. 4 and 5 are examples of a smaller planar solar concentrator power module 31 with two lens and circuit elements 33. The FIG. 4 power module 31 shows the unit from a side view whereas FIG. 5 shows the lenses magnifying the circuits from the top view. The FIG. 5 power module 31 is presented to show the lens magnification effect.

FIGS. 6 and 7 show one example of fabricating the linear circuits. FIG. 6 shows a section of the metal back sheet 25 with embossed terraces 35. FIG. 7 shows the cells mounted in these terraces in a shingle fashion 37 with the back edge 39 of one cell 41 overlapping the front edge 43 of the previously placed cell 45.

The cell design is typical for solar cells having complete metal deposited on the backside with a grid pattern on the front. In this case, the grid lines run in the circuit direction and connect to a bus bar on one edge of the top of the cell. The bus electrically connects to the back metal of the next cell. In this way, a front to back series connection is made between cells to make shingle circuits.

As shown in FIG. 1, there are circuit terminal pads 49 at the end of each circuit. Insulated metal elements, such as but not limited to, ribbons 47 and 51 connect these circuits to plus and minus panel terminals 13.

As shown in FIG. 3, an insulating film 53 (as for example paint) may be placed over the metal back plate 25 so that the circuit 7 is in good thermal contact with the metal back plate but not in electrical contact with the back plate.

We have previously described shingle circuits in the context of thermophotovoltaics. An important consideration for shingle circuits is that the coefficient of thermal expansion (CTE) of the metal back plate should be matched with the coefficient of thermal expansion of the cells so that the electrical connecting bonds between cells are not pulled apart as the module heats or cools. With matched CTES, the cells and metal back plate expand and contract together with changes in temperature. In the case of silicon solar cells, an appropriate metal may be, for example but not limited to, alloy 42 (Fe 58%, Ni 42%).

The shingle circuit assembly 37 depicted here is not the only way in which linear circuits 7 can be fabricated. Other fabrication methods are within the scope of this invention. For example, ribbon leads can be run from the back of one cell to the front of the next cell. Loops in the ribbon connections will allow for differences in CTEs so that an aluminum back plate may then be used. This assembly procedure can be automated although with more steps than for the shingle circuit fabrication sequence. Either circuit type, and assembly process, falls within the scope of the present invention.

FIG. 8 shows a perspective view of a planar solar concentrator power module 1. Note however, as shown in FIG. 5, the lens effect is not realistically depicted.

FIG. 9 shows several planar solar concentrator power-modules 1 mounted on a solar tracker 55. The present planar solar concentrator power module may be provided in solar powered water pumping devices which is used for irrigation worldwide. The advantages of the present module design include, but are not limited to, cheaper costs of production because it uses less expensive single crystal material, and easy availability and adaptability for immediate replacements in several different applications.

A preferred planar concentrator photovoltaic module comprises a planar array of linear Fresnel lenses in front of and aligned with a planar array of linear circuits. The circuits are mounted on a metal sheet allowing for heat spreading and heat removal.

The planar concentrator photovoltaic module further comprises lenses which are longer than the circuits such that the acceptance angle for sunlight in the length dimension is greater than or equal to 20 degrees allowing for polar axis tracking without seasonal adjustments.

The planar concentrator photovoltaic module comprises lens having widths about three times larger than the width of the cell and circuit. The image from the lens underfills the cells with dark bands on the cells on either side of the image allowing for the acceptance angle for sunlight in the width dimension to be greater than or equal to about 5 degrees.

The planar concentrator photovoltaic module further comprises a metal sheet upon which the circuits are mounted. The metal sheet has a coefficient of thermal expansion compatible with the coefficient of thermal expansion of the cells. The metal sheet is embossed with terraces upon which the cells are mounted in a linear shingle circuit.

FIGS. 10, 11, and 12 show the planar concentrator solar power module of the present invention. FIG. 10 shows alternating rows of linear shingled-cells and linear mirror elements where the mirrors deflect sun rays down to the cells. FIG. 11 shows a cross-section through the planar solar concentrator power module of FIG. 10 at A-A. The cross-section is perpendicular to the rows of cells and mirrors. FIG. 12 shows a blow-up section from FIG. 11 showing a circuit element and, as examples, two types of linear extrusions: the module side wall extrusion and the inner extrusions with triangular cross-sections.

A preferred unit measures, for example, about 20" by 44" by 3.25" deep, preferably 21" by 47" by 3.25" deep. The size depicted is exemplary and is similar to 75 W one-sun planar modules manufactured by BP Solar, Siemens, Kyocera, and Solarex. All of these one-sun modules measure approximately 20" by 44" or about 21" by 47" and produce about the same power. The one-sun planar modules consist of large silicon cells sandwiched between plastic sheets with a glass front plate surrounded by a 2" thick aluminum frame for rigidity.

The present planar concentrator solar module 100 consists of a back panel 103, preferably of metal sheet, upon which linear silicon-cell circuits 105 are mounted. In the example shown, there are four circuits containing cells 107 approximately 2.5" wide. The preferred circuit separation is approximately 5". Therefore, the cell area represents one half of the total module area resulting in a major cost reduction for cells. In the exemplary module, an approximately 3.25" thick aluminum frame 122 with end plates 123 surrounds the module with the cells mounted on the back panel 103.

Mirrors 109 are located between the rows of linear silicon-cell circuits 105. Referring to FIGS. 11 and 12, the mirrors 109 are mounted on the faces 111, 113 of the exemplary two types of linear extrusions 115, 117. Sun rays hitting each mirror 109 are deflected down onto the cells 107. The two types of linear extrusions are the module side-wall extrusions 115, and the inner extrusions with triangular cross-section 117.

The present module shown is mechanically assembled as follows. Cells 107 are first mounted on the metal heat spreader plate 103. For low cost, the cells 107 are mounted in shingled-cell circuits 105. The heat spreader plate 103 is captured in slots 119 in the side wall extrusions 115. There are fastener holes 121 running from end to end in both types of extrusions 115, 17. Fasteners such as, but not limited to, sheet metal screws 120 (FIG. 10) running through holes 121 in end plates 123 (FIG. 10) connect all of the elements together.

As noted above a problem for solar concentrators has been the high investment required to scale up production of a new concentrator cell. Therefore, it is desirable to use planar solar cells that are already in high volume production at low cost. FIGS. 13A-C show how to produce the solar concentrator cells 130 at low costs by simply cutting a commercial planar cell 132 into four parts. FIG. 13A shows a commercial planar cell 132. FIG. 13B shows the cell of FIG. 13A cut up into four 2× concentrator-cells 130. FIG. 13C shows the cells reassembled into a shingled-cell circuit element 134.

Another problem solved by the invention is the cell-interconnects for concentrator modules. A standard one-sun planar module typically has thirty-six 5" square cells. While the present concentrator module has half the cell area, each cell is one quarter the area of a planar one-sun cell. Therefore, there are twice the number of cells or 72 cells. If stitch ribbon bonds from cell to cell are used, as is typical for planar modules, twice the number of bonds will be required, which will increase assembly cost. This problem is resolved by making shingled-cell circuit elements 134 as shown in FIGS. 13B, 13C, and 14.

FIG. 13C shows a top view of an exemplary shingled-cell element 134 containing four cells. FIG. 14 shows the side view of a circuit row 136 containing two shingled-cell circuit elements 134 mounted on the heat spreader metal back-plate 138 with stress relief ribbon bonds 40 between circuit elements 134. In a shingled-cell element 134, cells 142 are mounted in a shingle fashion with the back edge 144 of one cell overlapping the front edge 146 of the previously placed cell. The shingled-cell design is used for solar cells having a complete metal deposited on the backside with a grid and bus pattern on the front. In this case, the bus runs in the circuit direction. The bus electrically connects to the back metal of the next cell. In this way, a front to back series connection is made between cells to make shingle circuit element. There are half as many bonds used for shingled-cell circuits as when stitch ribbons are used from cell to cell.

As pointed out above, an important consideration for shingle circuits is that the coefficient of thermal expansion (CTE) of the metal back plate should be matched with the coefficient of thermal expansion of the cells so that the electrical connecting bonds between cells are not pulled apart as the module heats or cools. With matched CTEs, the cells and metal back plate expand and contract together with changes in temperature. In the case of silicon solar cells, an appropriate metal may be alloy-42 (Fe 58%, Ni 42%).

It is also possible to use shingled-cell elements even if there is not a perfect CTE match between the cells and the metal backing plate. This is done by providing flexibility in the adhesive 148 used to bond the cells 142 to the metal back plate and by providing periodic stress relief ribbon bonds 140. FIG. 14 shows a stress relief ribbon bond 140 between two shingled-cell circuit elements 134. Cells in the back panel may be protected by lamination with a transparent encapsulant 149. Lamination may be, but is not limited to, a transparent plastic sheet covered by a transparent Teflon sheet or a glass plate as used in the planar modules.

Another problem is to determine how often stress relief ribbon bonds 140 are required. The present invention provides a solution to this problem. For example, 4" long Si cells have been mounted with flexible thermally conductive adhesive to aluminum plates and operated for ten years in a solar concentrator prototype without failure. The CTE difference between aluminum and silicon is $(22-4) \times 10^{-6}$ per C. In the present invention using a carbon steel back plate with a CTE difference of $(11-4) \times 10^{-6}$ per C, or 2.5 times less, uniquely allows for the use of a shingled-cell element 2.5 times longer than 4" or 10" long, as shown in FIG. 14.

Figure 15:
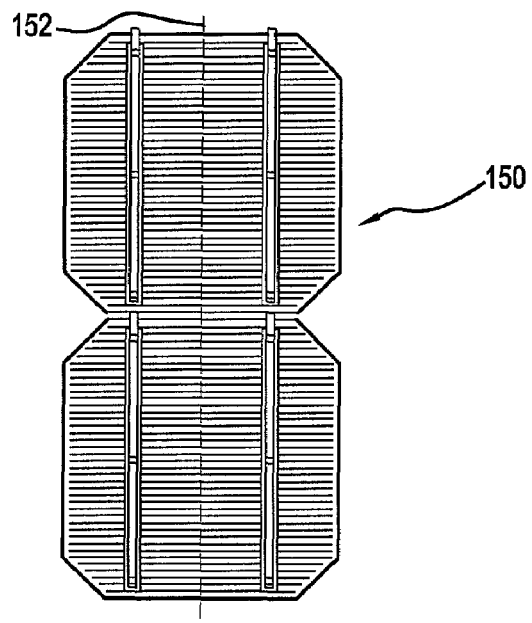
FIG. 15 is a top view of two series connected standard planar cells.
Figure 16:
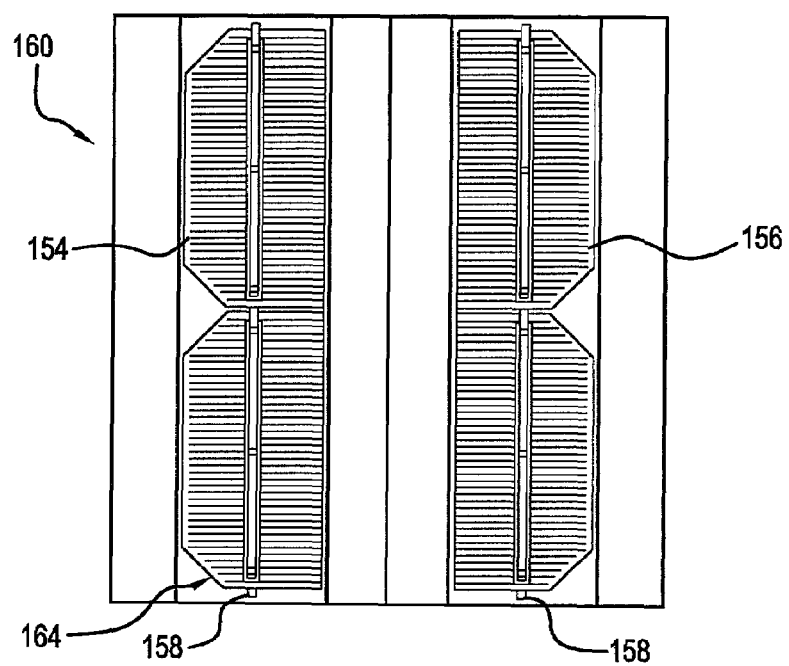
FIG. 16 is a top view of two series connected standard planar cells cut in half and mounted in a 2-sun concentrator mirror module.
Figure 17:
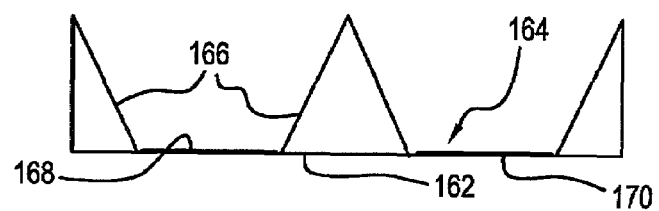
FIG. 17 is an end view of the cell and module of FIG. 16.

The invention addresses the high-cost problems for solar concentrators requiring scale up production of new concentrator cells. FIGS. 15, 16, and 17 show how to use planar solar cells already in high volume production in the present modules. The present solar concentrator cells are formed by cutting up commercial planar cells into halves.

In the 2× mirror module, as shown in FIGS. 15, 16, and 17, planar cells 150 are cut in half 152, separated by mirror elements 166 and operated at 2× concentration with the mirrors. Thus half the number of planar cells 154, 156 are used to form a module 160 with the same power. Also, a further advantage is that half the number of ribbon bonds 158 are required. Ribbon bonding techniques are similar to the planar module requiring no additional equipment nor manpower for mirror module fabrication.

The metal back plate 162 with linear circuits 164 are formed as shown in FIGS. 16 and 17. After the cells 150 are cut and ribbon bonded 158 front to back, the circuit strings 168 are bonded to the metal back plate 162 with thermally conductive epoxy 170. The circuits 164 are electrically isolated from the metal back plate. After the circuits 164 are bonded to the metal back plate 162 and wired together, the cells in the back panel are then protected by lamination with a transparent encapsulant. Lamination may be, but is not limited to, a transparent plastic sheet covered by a transparent Teflon sheet or a glass plate as used in the planar modules, as shown at 149 in FIG. 14.

The interconnect procedures for connecting ribbons to cells front to back is similar to that used in the planar modules. The ribbon connections are labor intensive and therefore alternative ways may be used for the interconnections. For example, shingled cell circuits are made as shown in FIGS. 13A-C and 14, which enables a faster cell-circuit assembly using automated equipment.

The present cell and mirror height dimensions are preferably between 2" and 3", more preferably 2.5". That allows for a panel thickness of about 3.25", not too much thicker than a standard planar solar panel with thickness of about 2". Also, it provides optimal thermal management. The mirrors concentrate the solar energy into the circuits. The waste heat then is transferred to the metal back plate. It then spreads laterally through the metal such that the metal plate temperature is nearly uniform. If the spacing between circuits is too large, the heat will not spread uniformly and the circuits will run too hot. A preferred spacing of about 5", or about 2.5" from each cell edge to the next cell edge, allows for a uniform plate temperature with a reasonably thin and light back metal plate.

Linear circuits and mirrors provide several advantages. Firstly, aluminum extrusions and linear shingled circuits are easy to make. Secondly, it provides for optimal seasonal alignment. The sun midday position moves north and south+/−23° from summer to winter. This movement is accommodated using a linear mirror by making the mirror length longer than the circuit length and aligning the mirror focal line in the north/south direction. The present module circuits are about 1.4" shorter than the mirrors at both ends which uniquely gives a tracking tolerance in north/south direction of $\tan^{-1}(1.4/3.25)=+/-23°$. Preferably, providing circuits shorter by about 1.2" than the mirrors at both ends gives tracking tolerance in the north/south direction of $\tan^{-1}(1.2/2.5)=+/-25°$.

The invention also provides pointing tolerance in the east/west direction. If the mirror tilt angle referenced to the normal from the cell plane is 30°, then all of the rays reflected by the mirrors will fall on the cells as long as the module is precisely pointed at the sun. This invention provides a pointing tolerance of approximately +/−2° translating to a mirror tilt off-normal angle of approximately 26°.

The present invention allows for the manufacture of modules at a cost below today's module cost. Target prices are in about the $3 to $4 per Watt range, preferably at about the $1 to $2 per Watt cost range, well below the $6 to $7 per Watt price range of present modules.

While the invention has been described with reference to specific embodiments, modifications and variations of the invention may be constructed without departing from the scope of the invention, which is defined in the following claims.

We claim:

1. A method of assembling a planar concentrator solar power module comprising obtaining existing, readily available commercial planar solar cells, each solar cell having a continuous grid electrode, cutting the solar cells in segments, each resulting segment comprising a portion of the grid electrode, mounting the divided cells in precisely spaced rows on a metal beat spreader back plate and forming a circuit element, connecting the cells in series to form linear circuit rows, mounting flat, linear mirrors on the plate, alternating the linear circuit rows and the flat, linear mirrors in the circuit element, deflecting sun rays with the linear mirrors on to the linear circuit rows, concentrating solar energy into the linear circuit rows, transferring waste heat to the metal heat spreader back plate spreading the waste heat laterally through the metal plate so that a temperature of the metal plate is nearly uniform, and providing optimal thermal energy management.

2. The method of claim 1, further comprising transferring waste heat generated from the concentrating solar energy to the metal back plate, spreading the waste heat laterally through the metal plate and causing a temperature of the metal plate to be uniform.

3. The method of claim 1, wherein the mounting the cells on the metal plate comprises providing adequate spacing between alternating circuits and allowing a temperature of the metal back plate to be uniform.

4. The method of claim 1, further comprising mounting linear extrusions on the metal back plate and mounting the flat, linear mirrors on faces of the linear extrusions and mounting the linear circuit rows between the mirrors.

5. The method of claim 1, further comprising allowing for optimal seasonal alignment by providing flat, linear mirrors longer than the linear circuit rows, aligning the mirror focal line in a north/south direction and giving a tracking tolerance in the north/south direction greater than or equal to 20 degrees.

6. The method of claim 5, further comprising allowing for a pointing tolerance in a east/west direction by providing a mirror tilt off-normal angle corresponding to a tracking movement of the sun.

7. The method of claim 6, wherein the off-normal angle is about 26°.

8. The method of claim 5, further comprising mounting the module on a single-axis tracker, wherein seasonal adjustment is not required.

9. The method of claim 1, wherein the assembly steps are automated.

* * * * *